United States Patent
Cheng et al.

(10) Patent No.: US 7,531,423 B2
(45) Date of Patent: May 12, 2009

(54) REDUCED-RESISTANCE FINFETS BY SIDEWALL SILICIDATION AND METHODS OF MANUFACTURING THE SAME

(75) Inventors: Kangguo Cheng, Beacon, NY (US); Louis Lu-Chen Hsu, Fishkill, NY (US); Jack Allan Mandelman, Flat Rock, NC (US); Haining Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 141 days.

(21) Appl. No.: 11/316,244

(22) Filed: Dec. 22, 2005

(65) Prior Publication Data

US 2007/0148836 A1 Jun. 28, 2007

(51) Int. Cl.
*H01L 21/76* (2006.01)
(52) U.S. Cl. ............... 438/409; 438/508; 438/583; 438/603; 438/960; 257/E33.018; 257/E31.013; 257/E21.151
(58) Field of Classification Search ........... 438/135, 438/142, 400, 404, 408, 409, 960, 508, 583, 438/603, FOR. 231; 257/E21.19, E21.2, 257/E21.21, E33.018, E31.013, E21.151
See application file for complete search history.

(56) References Cited

U.S. PATENT DOCUMENTS

| 6,255,214 B1 | 7/2001 | Wieczorek et al. | |
|---|---|---|---|
| 2004/0036126 A1 | 2/2004 | Chau et al. | |
| 2004/0099885 A1 | 5/2004 | Yeo et al. | |
| 2004/0169269 A1* | 9/2004 | Yeo et al. .................. | 257/692 |
| 2005/0048750 A1* | 3/2005 | Kim ........................... | 438/586 |
| 2005/0090067 A1 | 4/2005 | Jawarani | |
| 2005/0255643 A1 | 11/2005 | Ahn et al. | |
| 2005/0258477 A1 | 11/2005 | Saito | |
| 2005/0272235 A1 | 12/2005 | Wu et al. | |
| 2006/0006466 A1* | 1/2006 | Iinuma ....................... | 257/347 |

FOREIGN PATENT DOCUMENTS

WO WO0017914 A2 3/2000

OTHER PUBLICATIONS

Ramos, et al., "Synthesis of Colbalt Silicide on Porous Silicon by High Dose Ion Implantation", Nuclear Instruments & Methods in Physics Research, Section B: Beam Interactions with Materials and Atoms, May 2001, pp. 283-286 vol. 178, No. 1-4, Elsevier, Amsterdam, NL.

Ramos et al., "Ion Beam Synthesis of Chromium Silicide on Porous Silicon", Nuclear Instruments & Methods in Physics Research, Section B: Beam Interactions with Materials and Atoms, Mar. 2000, pp. 926-930, vol. 161-163, Elsevier, Amsterdam, NL.

(Continued)

*Primary Examiner*—W. David Coleman
*Assistant Examiner*—Su C Kim
(74) *Attorney, Agent, or Firm*—Dugan & Dugan

(57) ABSTRACT

In a first aspect, a first method of manufacturing a finFET is provided. The first method includes the steps of (1) providing a substrate; and (2) forming at least one source/drain diffusion region of the finFET on the substrate. Each source/drain diffusion region includes (a) an interior region of unsilicided silicon; and (b) silicide formed on a top surface and sidewalls of the region of unsilicided silicon. Numerous other aspects are provided.

3 Claims, 10 Drawing Sheets

OTHER PUBLICATIONS

Lifshitz, Nadia, "Dependence of the Work-Function Difference Between the Polysilicon Gate and Silicon Substrate on the Doping Level in Polysilicon", IEEE Transactions on Electron Devices, IEEE Service Center, Mar. 3, 1985, pp. 617-621, vol. ED-32, No. 3, Pisacataway, NJ, USA.

V. Lehmann et al., "Porous silicon formation: A quantum wire effect", Feb. 25, 1991, Appl. Phys. Lett.—American Institute of Physics, pp. 856-858.

Lisa T. Su et al.,"Optimization of Series Resistance in Sub-0.2 µm SOI MOSFET's", Sep. 1994, IEEE Electron—Device Letters, vol. 15, No. 9, pp. 363-365.

A. El-Bahar et al., "A technique to form a porous silicon layer with no backside contact by alternating current electrochemical process", Jul. 10, 2000, Applied Physics Letters, vol. 77, No. 2, pp. 208-210.

Edward J. Nowak et al., "Turning Silicon On It's Edge", Jan./Feb. 2004, IEEE Circuits & Devices Magazine, pp. 20-31.

* cited by examiner

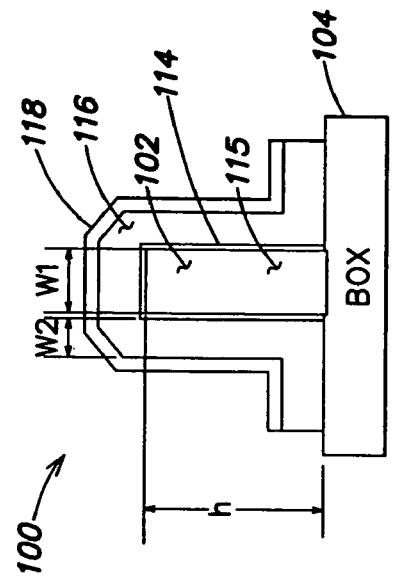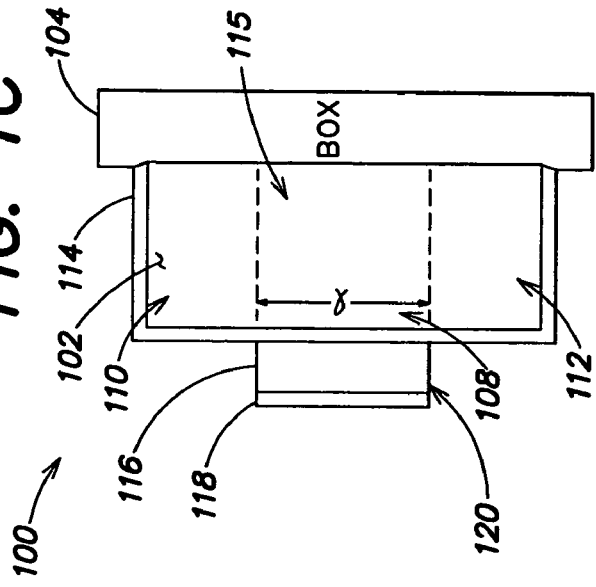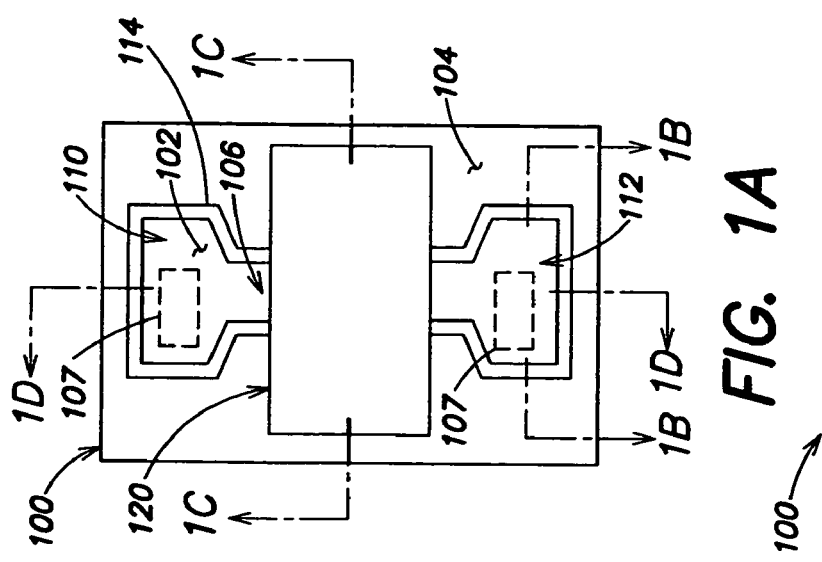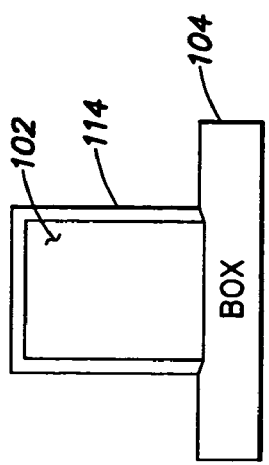

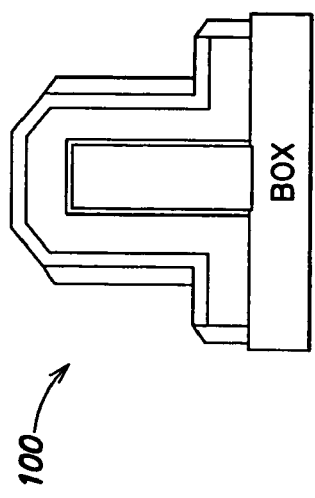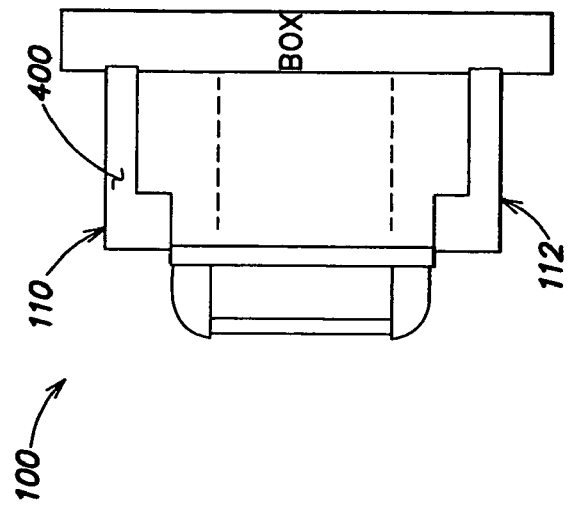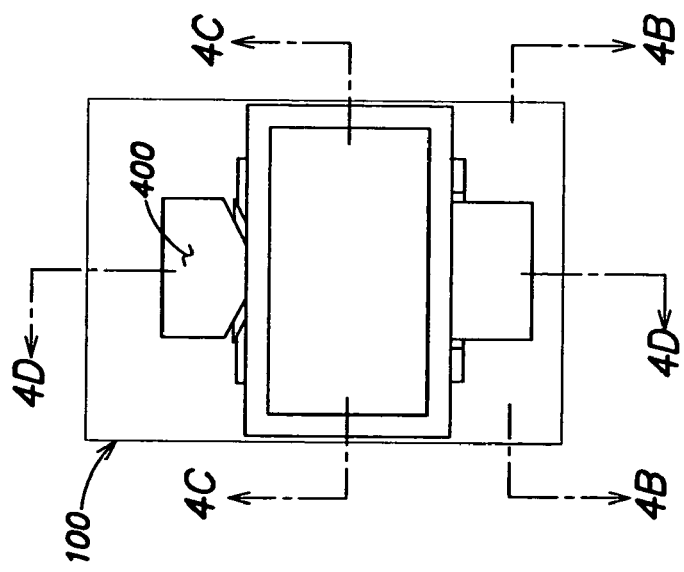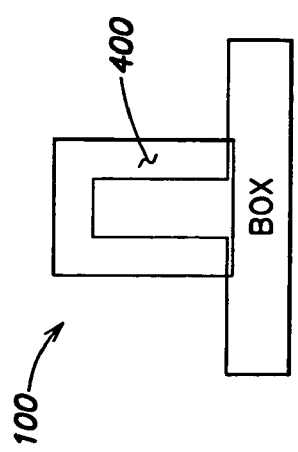

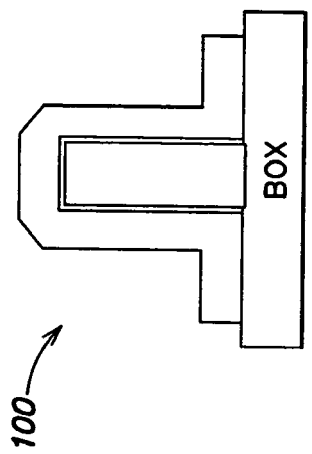
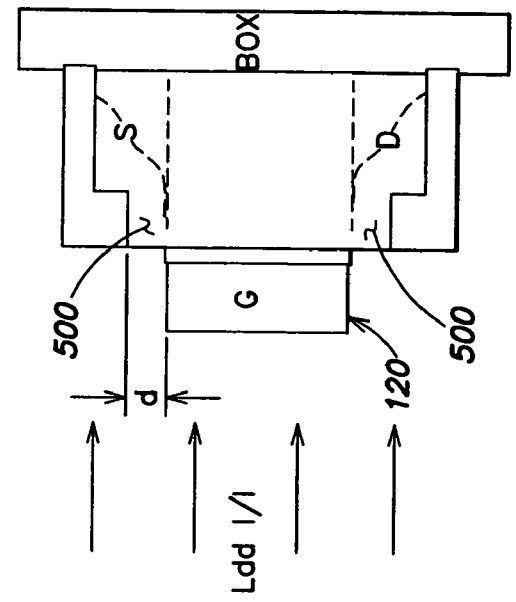
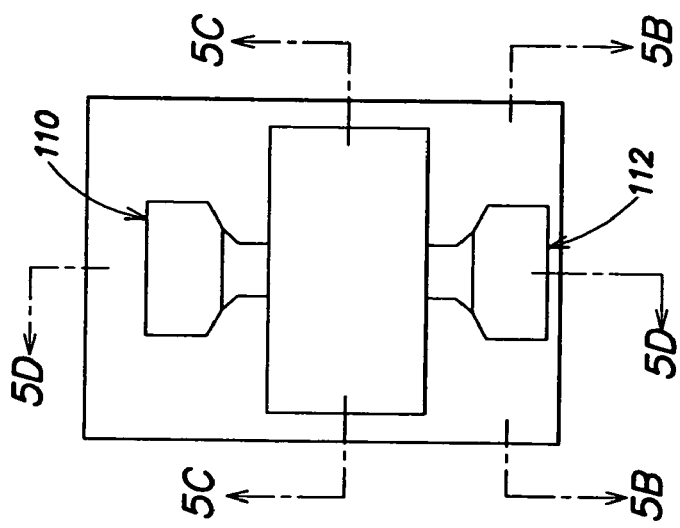
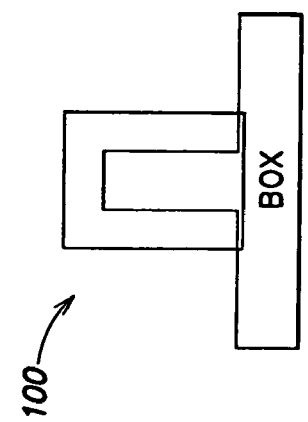

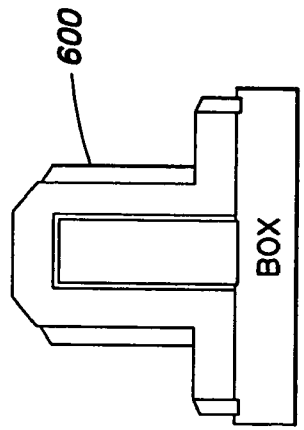
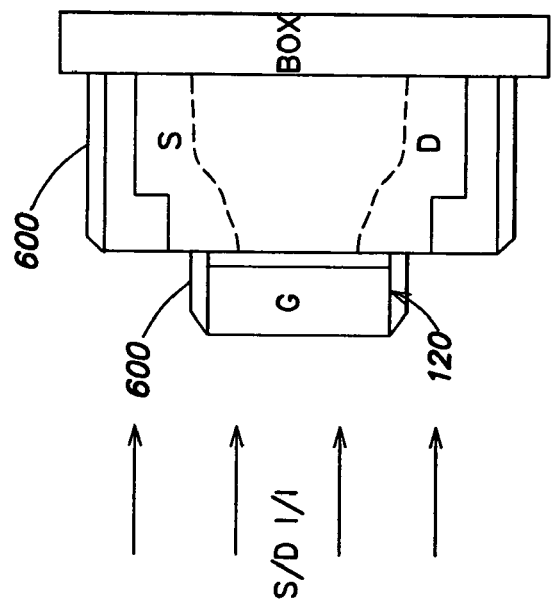
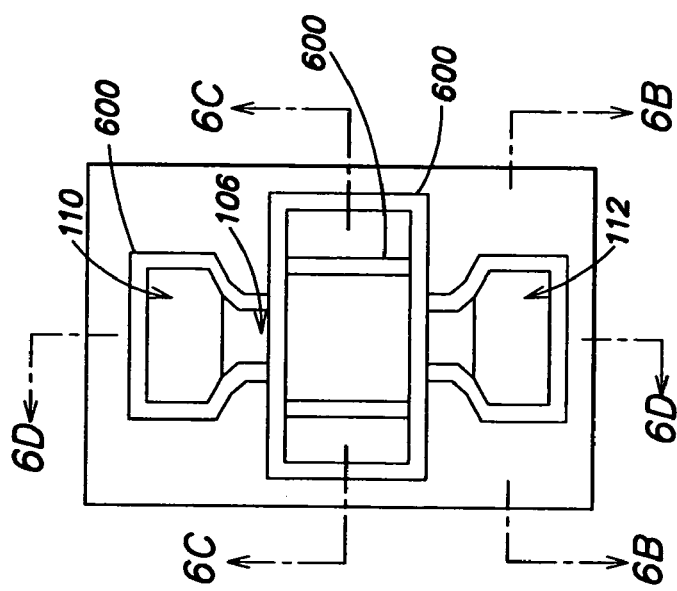
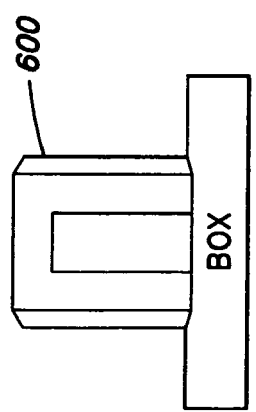

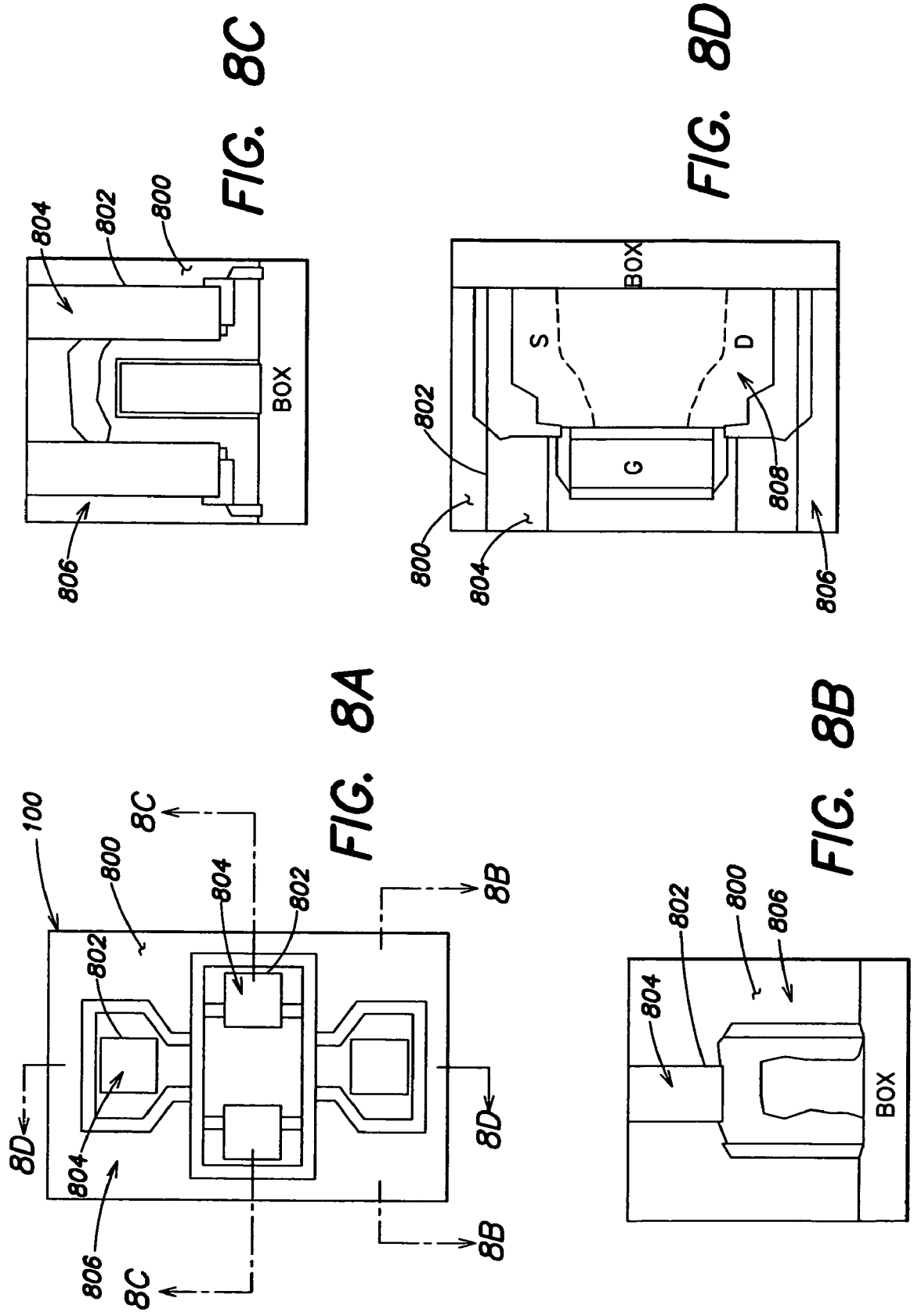

REDUCED-RESISTANCE FINFETS BY SIDEWALL SILICIDATION AND METHODS OF MANUFACTURING THE SAME

FIELD OF THE INVENTION

The present invention relates generally to semiconductor device manufacturing, and more particularly to reduced-resistance finFETs and methods of manufacturing the same.

BACKGROUND

A finFET is a transistor that includes a narrow fin (e.g., of silicon) with gate conductors either on two opposing sidewalls of the fin, or on two opposing sidewalls and the top surface of the fin. An overall resistance of the finFET is strongly determined by the area of an interface between a silicide layer and silicon in the source/drain regions of the finFET. Conventional finFETs may include a silicide formed on portions of a top surface of silicon in a source/drain region of the finFETs. However, such finFETs exhibit a high resistance, which is undesirable, because of the small area available at the top surface of the fin. Consequently, improved finFETs and methods of manufacturing the same are desired.

SUMMARY OF THE INVENTION

In a first aspect of the invention, a first method of manufacturing a finFET is provided. The first method includes the steps of (1) providing a substrate; and (2) forming at least one source/drain diffusion region of the finFET on the substrate. Each source/drain diffusion region includes (a) an interior region of unsilicided silicon; and (b) silicide formed on a top surface and sidewalls of the region of unsilicided silicon.

In a second aspect of the invention, a first apparatus is provided. The first apparatus is a finFET that includes at least one source/drain diffusion region formed on a substrate. Each source/drain diffusion region includes (1) an interior region of unsilicided silicon; and (2) silicide formed on a top surface and sidewalls of the region of unsilicided silicon.

In a third aspect of the invention, a first system is provided. The first system is a substrate that includes a finFET having at least one source/drain diffusion region formed on the substrate. Each source/drain diffusion region includes (1) an interior region of unsilicided silicon; and (2) silicide formed on a top surface and sidewalls of the region of unsilicided silicon. Numerous other aspects are provided in accordance with these and other aspects of the invention.

Other features and aspects of the present invention will become more fully apparent from the following detailed description, the appended claims and the accompanying drawings.

BRIEF DESCRIPTION OF THE FIGURES

FIGS. 1A-D are block diagrams of respective top, first cross-sectional front, second cross-sectional front and cross-sectional side views of a substrate following a step of a method of manufacturing a finFET in which a body region having source/drain diffusion regions and a gate region are formed in accordance with an embodiment of the present invention.

FIGS. 4A-D are block diagrams of respective top, first cross-sectional front, second cross-sectional front and cross-sectional side views of the substrate following a step of the method of manufacturing a finFET in which porous silicon is formed in the source/drain diffusion regions in accordance with an embodiment of the present invention.

FIGS. 5A-D are block diagrams of respective top, first cross-sectional front, second cross-sectional front and cross-sectional side views of the substrate following a step of the method of manufacturing a finFET in which the substrate undergoes a second implant in accordance with an embodiment of the present invention.

FIGS. 6A-D are block diagrams of respective top, first cross-sectional front, second cross-sectional front and cross-sectional side views of the substrate following a step of the method of manufacturing a finFET in which the substrate undergoes a third implant in accordance with an embodiment of the present invention.

FIGS. 8A-D are block diagrams of respective top, first cross-sectional front, second cross-sectional front and cross-sectional side views of the substrate following a step of the method of manufacturing a finFET in which back-end-of-line (BEOL) processing is performed in accordance with an embodiment of the present invention.

DETAILED DESCRIPTION

Figure 2C:
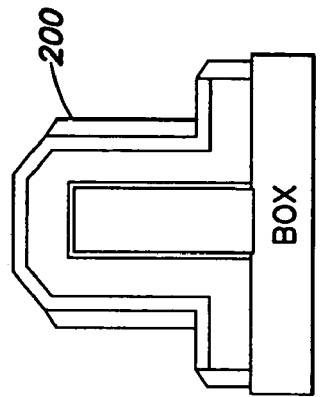
FIGS. 2A-D are block diagrams of respective top, first cross-sectional front, second cross-sectional front and cross-sectional side views of the substrate following a step of the method of manufacturing a finFET in which spacers are formed adjacent the body region and gate region in accordance with an embodiment of the present invention.
Figure 2D:
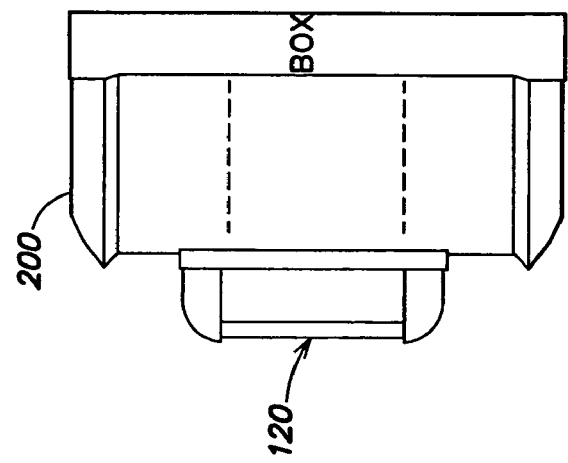
Figure 2A:
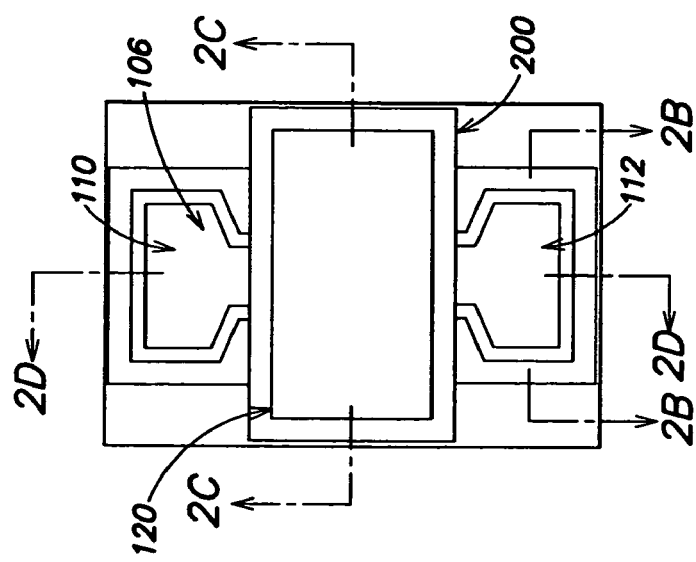
Figure 2B:
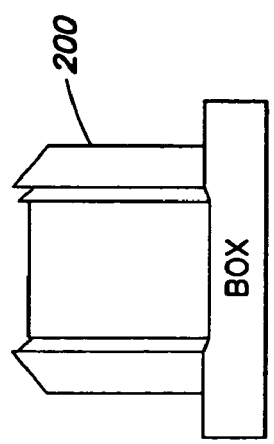
Figure 3C:
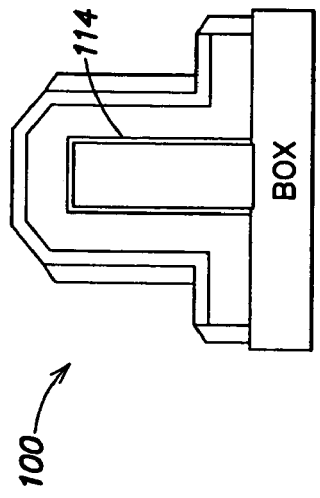
FIGS. 3A-D are block diagrams of respective top, first cross-sectional front, second cross-sectional front and cross-sectional side views of the substrate following a step of the method of manufacturing a finFET in which one or more portions of the spacers are removed from the substrate in accordance with an embodiment of the present invention.
Figure 3D:
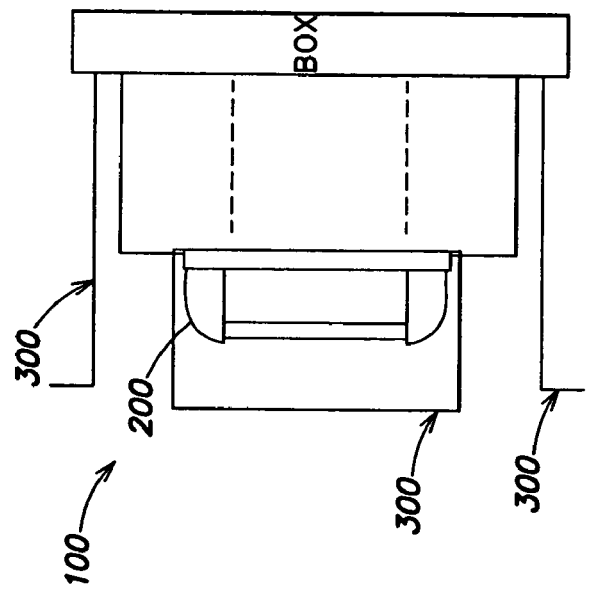
Figure 3A:
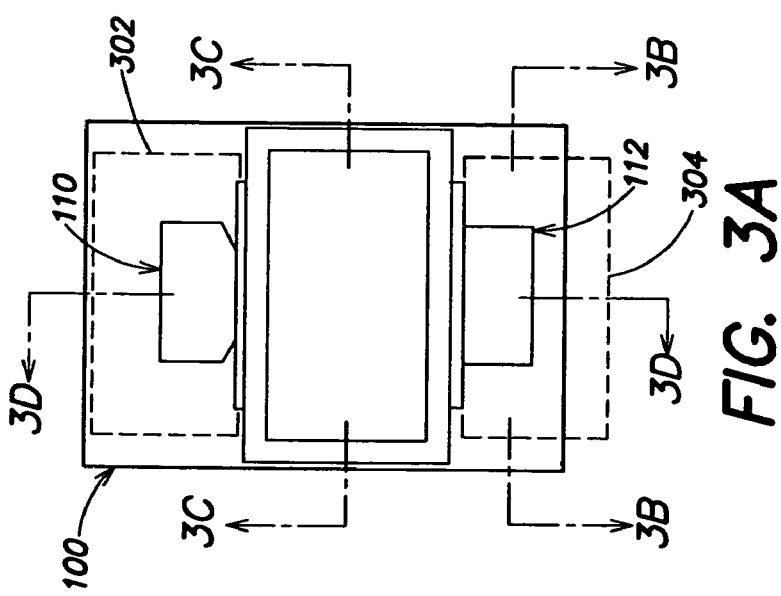
Figure 3B:
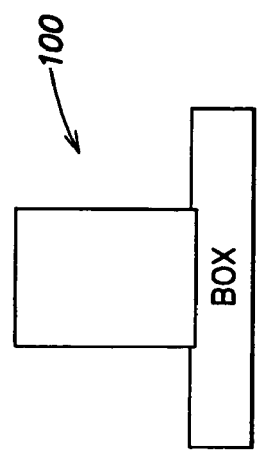
Figure 7C:
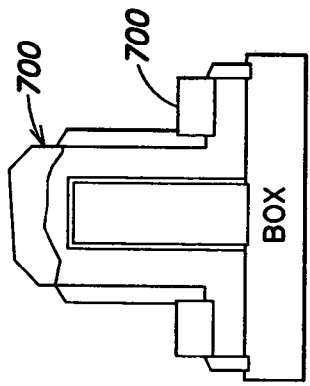
FIGS. 7A-D are block diagrams of respective top, first cross-sectional front, second cross-sectional front and cross-sectional side views of the substrate following a step of the method of manufacturing a finFET in which silicide is formed on the substrate in accordance with an embodiment of the present invention.
Figure 7D:
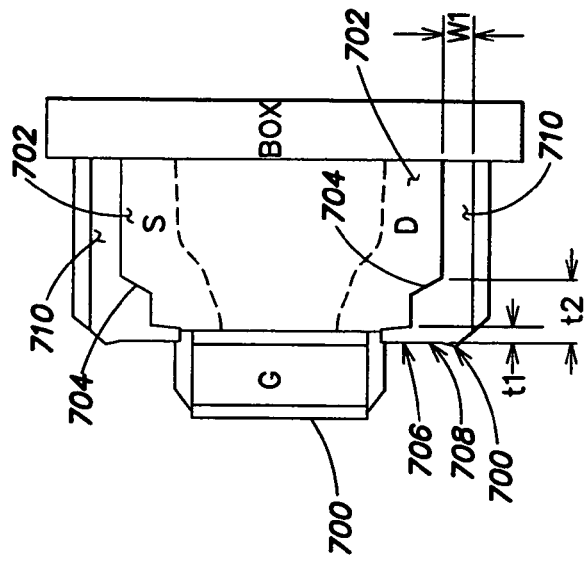
Figure 7A:
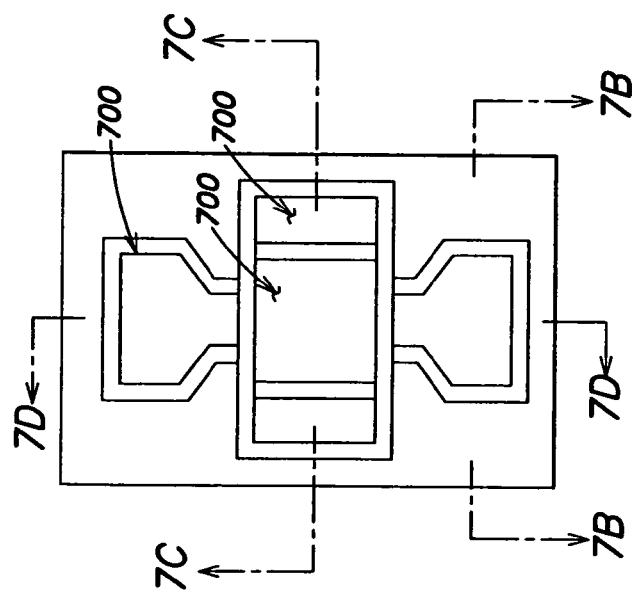
Figure 7B:
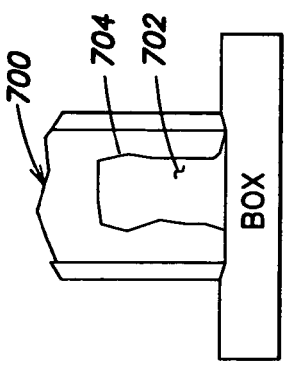

The present invention provides an improved fin MOSFET (FinFET) and methods of manufacturing the same. More specifically, the present invention provides a finFET with silicide formed on a top surface of and sidewalls of silicon in at least one source/drain diffusion region of the finFET and methods of manufacturing the same. In this manner, the source/drain diffusion region includes an interior unsilicided region (e.g., silicon) nearly surrounded by silicide. Therefore, an area of an interface of the silicide and silicon in the finFET source/drain diffusion region is increased compared to conventional finFETs. Consequently, a resistance of the finFET manufactured in accordance with an embodiment of the present invention may be reduced compared to conventional finFETs.

To form the silicide around portions of silicon in the source/drain diffusion region as described above, portions of silicon in the source/drain diffusion region may be converted to porous silicon. Thereafter, a layer of metal may be deposited on the substrate. Silicidation may be employed to cause the metal to react with silicon of the substrate such that silicide is formed around portions of silicon in the source/drain diffusion region as described above. In this manner, the present invention provides an improved finFET and methods of manufacturing the same.

FIGS. 1A-D are block diagrams of respective top, first cross-sectional front, second cross-sectional front and cross-sectional side views of a substrate following a step of a method of manufacturing a finFET in which a body region having source/drain diffusion regions and a gate region are formed in accordance with an embodiment of the present invention. With reference to FIGS. 1A-D, a substrate 100 may be provided. The substrate 100 may include a silicon-on-insulator (SOI) layer. Alternatively, the substrate 100 may include a bulk substrate layer. Although a method of manufacturing a finFET with a reduced source-drain resistance is described below with reference to an SOI substrate, the present invention includes methods of manufacturing a finFET with a reduced source-drain resistance on a bulk substrate. Such methods may employ different isolation techniques.

The substrate 100 may include a layer of silicon 102 (e.g., single crystal silicon) formed on a layer of oxide (e.g., buried oxide) 104. RIE or another suitable method may be employed to remove portions of the silicon layer 102 such that a body region 106 may be formed. The body region 106 may include at least one source/drain diffusion region and define a gate channel region 108. Further, the body region 106 may include one or more source/drain contact regions 107. For example, the body region 106 may include a first source/drain diffusion region 110 and a second source/drain diffusion region 112. Chemical vapor deposition (CVD) or another suitable method may be employed to form a layer of dielectric material 114 and/or another suitable material around the body region 106. As shown, the body region 106 may be a "dog bone"-shaped silicon island (although the body region may have a different shape). In this manner, the body region 106 may provide an increased contact area and/or an area within the source/drain diffusion region 110, 112 normal to the direction of the current density. The source-drain current density is predominantly determined by the majority carrier flux. The majority carrier flux refers to charge carriers (electrons or holes) normal to the interface between the source/drain diffusion and the silicide. In an NFET the source/drain diffusions are heavily N-type doped and the majority carrier flux comprises electrons. In a PFET the source/drain diffusions are heavily P-type doped and the majority carriers are holes. A portion 115 of the body region 106 between the first and second source/drain diffusion regions 110-112 may serve as a silicon fin of the finFET being manufactured. The fin may have a height h of about 50 nm to about 500 nm and a width w1 of about 5 nm to about 100 nm (although a larger or smaller and/or different height range may be employed). In this manner, the fin may be design to be narrow enough to enable fully-depleted body operation which may result in volume inversion, high carrier mobility and/or increased control of electric potential in the body region 106. Consequently, the finFET being manufactured may provide an "on"/"off" current ratio that is superior to a planar MOSFET.

CVD or another suitable method may be employed to deposit a layer of polysilicon material 116 or another suitable material on the substrate 100, and a layer of nitride 118 or another suitable material thereon. RIE or another suitable method may be employed to remove portions of the polysilicon material layer 116 and nitride layer 118 such that the polysilicon material layer 116 and nitride layer 118 are formed on a portion of the body region 106 between source/drain diffusion regions 110-112 thereof. The polysilicon material layer 116 and dielectric layer 114 may serve as a gate 120 (e.g., gate region or stack) of finFET being manufactured. More specifically, the polysilicon material layer 116 may serve as a gate conductor layer. Further, the nitride layer 118 may serve as a gate capping layer. Consequently, the gate 120 may be formed around multiple (e.g., three) sides of the body region 106. For example, a three-sided gate 120 may be formed on portions of opposing approximately vertical sidewalls and a portion of a top surface of the body region 106. The gate 120 may have a length l of about 18 nm to about 130 nm (although a larger or smaller and/or different length range may be employed). The length l of the gate 120 may determine the length of a channel formed in the finFET.

FIGS. 1A-8D are not drawn to scale. For example, for illustrative purposes a width w1 of the fin and a width w2 of the gate conductor layer are intentionally enlarged. However, in an actual finFET device both the width w1, w2 of the gate conductor and the fin are significantly narrower than that shown in these drawings.

FIGS. 2A-D are block diagrams of respective top, first cross-sectional front, second cross-sectional front and cross-sectional side views of the substrate following a step of the method of manufacturing a finFET in which spacers are formed adjacent the body region and gate region in accordance with an embodiment of the present invention. With reference to FIGS. 2A-D, CVD or another suitable method may be employed to form a layer of silicon nitride or another suitable material on the substrate 100. RIE or another suitable method may be employed to remove portions of the silicon nitride layer such that spacers 200 are formed adjacent sidewalls of the body region 106 and the gate 120. The spacers 200 may be about 10 nm to about 100 nm wide (although a larger or smaller and/or different width range may be employed). During RIE to form the spacers 200, portions of the dielectric material layer 114 may be removed. For example, portions of the dielectric material layer 114 on a top surface of source/drain diffusion regions 110-112 of the body region 106 may be removed.

The spacers 200 may serve as sacrificial or temporary spacers employed to protect portions of the gate conductor layer 116 during subsequent processing. In this manner, a spacer width may be employed such that subsequently-formed silicide may be prevented from penetrating into a junction of the finFET as described below. Penetration of the silicide into the junction regions of the source/drain diffusion regions may result in severe leakage currents and must be avoided.

FIGS. 3A-D are block diagrams of respective top, first cross-sectional front, second cross-sectional front and cross-sectional side views of the substrate following a step of the method of manufacturing a finFET in which one or more portions of the spacers are removed from the substrate in accordance with an embodiment of the present invention. With reference to FIGS. 3A-D, a spin-on technique or another suitable method may be employed to deposit a photoresist layer or another suitable material layer on the substrate 100. The photoresist layer may be patterned with a mask such that portions of the photoresist layer may be removed during a subsequent process (e.g., developing). In this manner a trim mask 300 may be formed. Although the trim mask 300 described above comprises photoresist, in some embodiments, the trim mask may comprise a hard mask material. Dotted boxes 302, 304 illustrate portions of the substrate 100 that may be exposed by the trim mask 300 during subsequent processing. For example, the trim mask 300 may be employed during RIE or another suitable method to remove portions of the spacers 200 and/or the dielectric material layer 114 adjacent source/drain diffusion regions 110-112 of the body region 106. In this manner, a larger area of the source/drain diffusion regions 110-112 (e.g., including sidewalls thereof) may be exposed during subsequent processing, thereby improving contact to the source/drain diffusion regions thereof.

FIGS. 4A-D are block diagrams of respective top, first cross-sectional front, second cross-sectional front and cross-sectional side views of the substrate following a step of the method of manufacturing a finFET in which porous silicon 400 is formed in the source/drain diffusion regions 110-112 in accordance with an embodiment of the present invention. With reference to FIGS. 4A-D, impurity atoms (e.g., dopant) may be introduced into exposed portions of the substrate 100. For example, exposed portions of the substrate 100, such as source/drain diffusion regions 110-112, may be doped to form a p+ impurity species layer (which is later converted to porous silicon 400), such as boron or the like. The p+ doped layer may have a peak concentration of about $5 \times 10^{17}$ cm$^{-3}$ to about $1 \times 10^{21}$ cm$^{-3}$ (although a larger or smaller and/or different concentration range may be employed). The thickness of the p+ doped layer preferably ranges from 5 nm to 100 nm (although a larger or smaller thickness may be employed). The P+ doped layer is preferably formed by plasma immersion implantation. Alternatively, solid source doping, gas phase doping, or angled ion implantation processes, or combinations thereof, may be employed to form the p+ doped layer. In some embodiments, a thin layer of CVD nitride or another suitable material may be employed as a mask to block doping of portions of the substrate 100.

An anodization process may be employed to convert the doped (e.g., p+ doped) silicon to porous silicon. For example, contactless anodization such as that described in "A technique to form a porous silicon layer with no backside contact by alternating current electrochemical process," A. El-Bahar, Y. Nemirovsky, *Applied Physics Letters*, v 77, n 2, Jul. 10, 2000, p 208-210 may be employed to form porous silicon in an SOI layer, which is electrically insulated from a contacted substrate. During such anodization, an AC voltage excitation may be applied to the substrate 100, with the insulated silicon layer 102 being capacitively coupled to the substrate 100. A reaction that forms the porous silicon 400 in the source/drain diffusion regions 110-112 may occur while an AC anode, which may be positive relative to the cathode, is excited. A fluoride-containing acidic electrolyte solution or the like may be employed for etching (e.g., anodic etching) during anodization. In this manner, a contactless anodization method (e.g., a method which may not require direct electrical contact with the substrate 100) may be employed to form porous silicon 400 as described above. In some embodiments, an excitation frequency of between about 500 Hz and about 10 kHz, an RMS current density of about_5 mA/cm$^2$ to about 200 mA/cm$^2$, and silicon regions having a p+ doping concentration of greater than about $10^{19}$/cm$^3$ may be may be employed to form the porous silicon 400 (although a larger or smaller and/or different range may be employed for the excitation frequency, current density and/or doping concentration). In this manner, pores (e.g., canals) having a diameter of about 1 nm to about 100 nm may be formed. A density of such pores ranges from about $10^9$ pores/cm$^2$ to about $10^{15}$ pores/cm$^2$. However, a larger or smaller and/or different diameter and/or density range may be employed. Consequently, pores of the porous silicon 400 may occupy about 30% to about 80% of an overall volume of the silicon 400 (although the pores may occupy a larger or smaller and/or different percentage range of the overall volume).

A stripper bath or another suitable method may be employed to remove the trim mask 300 from the substrate 100. Further, the substrate 100 may undergo annealing to remove excess dopant from the porous silicon 400. For example, the substrate 100 may undergo a hydrogen-ambient bake after the porous silicon 400 is formed such that some or all of the p+ dopant remaining in the source/drain diffusion regions 110-112 may be removed. During the hydrogen-ambient bake, the substrate 100 may be subjected to a temperature of about 850° C. to about 1100° C. for about 10 seconds to about 30 minutes (although a larger or smaller and/or different temperature range and/or time period may be employed).

FIGS. 5A-D are block diagrams of respective top, first cross-sectional front, second cross-sectional front and cross-sectional side views of the substrate following a step of the method of manufacturing a finFET in which the substrate undergoes a second implant in accordance with an embodiment of the present invention. With reference to FIGS. 5A-D, RIE or another suitable method may be employed to remove portions (e.g., remaining portions) of the spacers 200. Additionally, isotropic etching or another suitable method may be employed to remove exposed portions of the nitride layer 118 and/or the dielectric layer 114 from the substrate 100. In this manner, portions of the spacers 200 and/or the nitride layer 118 remaining while the porous silicon 400 is formed served to protect the gate 120 (e.g., polysilicon material layer 116 and dielectric layer 114) while forming the porous silicon 400. Further, the spacers 200 served to position an edge (e.g., sidewall) of the porous silicon 400 a predetermined distance d (e.g., based on the width of the spacers 200) from the gate 120. In this manner, a leakage current between such regions may be reduced and/or prevented. For example, a spiking through of a source/drain metal into a gate channel of the finFET may be reduced and/or eliminated. Consequently, the width of the spacer 200 may be employed such that subsequently-formed silicide may be prevented from penetrating into a gate-source/drain junction.

The substrate 100 may be subjected to angled ion implantations (Ldd I/I), such that lightly-doped source/drain diffusion (LDD) regions are formed within the N-channel and P-channel finFETs. For example, in accordance with standard MOSFET technology, a concentration of about $1 \times 10^{18}$ cm$^{-3}$ to about $5 \times 10^{19}$ cm$^{-3}$ may be employed for the LDD regions (although a larger or smaller and/or different concentration range may be employed). Standardly practiced LDD dopants such as arsenic, phosphorus or antimony N-type dopant species may be used for the N-channel finFETs, and boron or indium P-type species for the P-channel finFETs. In this manner, the substrate 100 may be lightly doped. More specifically, a region 500 of relatively low doping close to the gate 120 may be formed in the source/drain diffusion regions 110, 112.

FIGS. 6A-D are block diagrams of respective top, first cross-sectional front, second cross-sectional front and cross-sectional side views of the substrate following a step of the method of manufacturing a finFET in which the substrate undergoes a third implant in accordance with an embodiment of the present invention. With reference to FIGS. 6A-D, CVD or another suitable method followed by RIE or another suitable method may be employed to form spacers 600 (e.g., permanent spacers) on sidewalls of the gate 120 and sidewalls of the body region 106 including the source/drain diffusion regions 110, 112. The width of the spacers 600 may be less than the previously-formed spacers 200. For example, the spacers 600 may be about 5 nm to about 50 nm wide (although a larger or smaller and/or different width range may be employed).

The substrate 100 may be subjected to implantation, such as a source/drain ion implant (S/D I/I) or the like, such that junctions (e.g., of the source/drain diffusion regions 110, 112) of the finFET being manufactured may be formed. For example, a concentration of about $1 \times 10^{19}$ cm$^{-3}$ to about $5 \times 10^{20}$ cm$^{-3}$ of dopant may be introduced into the substrate 100 (although a larger or smaller and/or different concentration range and/or dopant type may be employed). In this, manner, the substrate 100 may be heavily doped with impurity atoms. For example, an angled source-drain ion implant S/D I/I may be performed through the porous silicon 400 to form a doped (e.g., heavily doped silicon) region underneath the porous silicon 400. Further, a gate conductor work function of the finFET being manufactured may be based on such doping. In this manner, a gate 120 has a work function which generally matches (e.g., is approximately equal to) the work function of the adjacent source-drain diffusions.

The second implant (e.g., light doping of the source/drain diffusion regions 110, 112) and the third implant (e.g., heavy doping of the source/drain diffusion regions 110, 112) are performed after porous silicon 400 is formed in the source/drain diffusion regions 110, 112. Therefore, dopants inserted into the substrate 100 during the second and third implants may penetrate through the porous layer 400 and form a junction. It should be noted the spacers 200 may cause the porous silicon 400 to be formed a predetermined distance (e.g., based on a width of the spacer 200) from a source-drain junction near the gate 120. Such distance may prevent silicide subsequently formed in the porous silicon 400 from encroaching (e.g., laterally) on such junction.

Implantation of impurity atoms through the porous silicon 400 during the third implant enables formation of heavy source-drain doping much deeper than the porous silicon 400 after the substrate 100 undergoes annealing. As described below, the porous silicon 400 may eventually be converted to a highly-conductive metallic silicide. Such silicide should not encroach (e.g., penetrate or spike through) the junctions. To reduce and/or eliminate such penetration (e.g., lateral penetration), spacer 200 is wider than the spacer 600, which may be employed to separate the lightly-doped and heavily-doped implants of the source/drain diffusion regions 110, 112. In this manner, substantially thick silicide subsequently may be formed inside the porous silicon 400 upon the source/drain diffusion regions 110, 112 but away from the edge of gate 120 so that a series resistance can be significantly reduced. However, closer to the gate 120 (e.g., along the edges of the polysilicon material layer 116 serving as the gate conductor) only a very shallow surface layer of the source/drain diffusion regions 110, 112 subsequently may be converted into silicide. Therefore, neither lateral nor vertical metal spiking will occur using the present method.

Thereafter, the substrate 100 may undergo annealing or another suitable process. For example, following the light and heavy doping of the source/drain diffusion regions 110, 112 (among other regions), the substrate 100 may be subjected to a dopant activation anneal, such as a rapid thermal anneal (RTA) or spike anneal at a temperature between about 950° C. and about 1150° C. for about 5 seconds to about 30 seconds (although a larger or smaller and/or different temperature and/or time period range may be employed). Further, a different type of annealing may be employed.

FIGS. 7A-D are block diagrams of respective top, first cross-sectional front, second cross-sectional front and cross-sectional side views of the substrate following a step of the method of manufacturing a finFET in which silicide is formed on the substrate in accordance with an embodiment of the present invention. With reference to FIGS. 7A-D, CVD or another suitable method may be employed to form a layer of metal, such as tungsten, cobalt, titanium, nickel and/or the like, on the substrate 100.

Thereafter, the substrate 100 undergoes silicidation. Silicidation of different regions of the substrate 100 may lower series resistance and enable better current drivability of the finFET. During silicidation, the metal may react with different portions of silicon on the substrate 100 such that silicide forms therein. For example, the porous silicon 400 may be silicided. More specifically, metal may be soaked into pores of the porous silicon 400. Silicidation may proceed more rapidly through the porous silicon 400 than through remaining portions of silicon in the source/drain diffusion regions 110, 112 and on remaining portions of the substrate 100. Consequently, a time period for silicidation of the porous silicon 400 and/or remaining portions of the finFET may be reduced. Further, a depth of a silicide layer 700 formed on the substrate 100 may be precisely controlled. More specifically, silicon in the entire source/drain diffusion regions 110, 112 may not be converted to silicide. Consequently, the present method may form an interior unsilicided silicon region 702 (e.g., an unsilicied silicon "core") within the source/drain diffusion regions 110, 112. Thus, an area of an interface 704 of the silicide layer 700 and unsilicided silicon region 702 is increased compared to a transistor having silicide formed only on a top surface of source/drain diffusion regions of the transistor and compared to a transistor having silicide formed in the entire source/drain diffusion region of the transistor. A resistance (e.g., a source-drain resistance) of a finFET may be based on (e.g., inversely proportional to) the area of such interface. Consequently, the unsilicided silicon "core" 702 formed by the present invention may reduce a series resistance of the finFET being manufactured. Further, the finFET may employ the unsilicided silicon "core" 702 to avoid reducing an area normal to the direction of the current density crossing the silicide/unsilicided silicon interface in source/drain diffusion regions 110, 112 of the finFET.

Process parameters employed while forming the porous silicon 400 may determine thicknesses of respective portions of the porous silicon 400. A thickness of the subsequently-formed silicide may be based on the porous silicon layer thickness. Therefore, the present invention may be employed to form a silicide layer 700 (as described above) portions of which may be thinner than a conventional silicide layer. In this manner, the present invention may be employed in finFETs with shallow junctions.

The silicide layer 700 formed in a source/drain diffusion region 110, 112 may have a first portion 706 having a thickness t1 of about 1 nm to about 5 nm (although a larger or smaller and/or different thickness range may be employed). Such portion 706 may serve as a contact (e.g., a thin contact) to the LDD silicon. Additionally, the silicide layer 700 formed in the source/drain diffusion region 110, 112 may have a second portion 708 having a thickness t2 of about 5 nm to about 100 nm (although a larger or smaller and/or different thickness range may be employed). Such portion 708 may serve as a contact (e.g., a thicker contact) to a top surface of silicon in the source/drain diffusion region 110, 112. Further, the silicide layer 700 formed in the source/drain diffusion region 110, 112 may have a third portion 710 having a width w1 of about 5 nm to about 100 nm (although a larger or smaller and/or different width range may be employed). Such portion 710 may serve as a contact to sidewalls of silicon in the source/drain diffusion region 110, 112. Consequently, the silicide layer 700 may form or define a region of silicon in the interior of the source/drain diffusion region 110, 112 (e.g., the unsilicided silicon "core" 702). Although a specific shape is described above for the silicide layer 700 in the source/drain diffusion regions 110, 112, the silicide layer 700 in the source/drain diffusion regions 110, 112 may have any shape adapted to increase an area of the interface 704 of the silicide layer 700 and silicon in the source/drain diffusion region 110, 112 of the finFET being manufactured. The silicide may have a resistivity of about 10 micro-ohm-cm to about 100 micro-ohm-cm (although a larger or smaller and/or different resistivity range may be employed).

Thereafter, RIE or another suitable method may be employed to remove unreacted metal from the substrate 100. Such RIE may be selective to silicide.

FIGS. 8A-D are block diagrams of respective top, first cross-sectional front, second cross-sectional front and cross-sectional side views of the substrate following a step of the method of manufacturing a finFET in which back-end-of-line (BEOL) processing is performed in accordance with an embodiment of the present invention. With reference to FIGS. 8A-D, CVD or another suitable method may be employed to deposit an insulator layer 800, such as a planarizing glass (e.g., undoped TEOS, phosphosilicate glass (PSG), borosilicate glass (BSG), borophosphosilicate glass (BPSG) and/or the like) on a top surface of the substrate 100. Thereafter, the insulator layer 800 may be planarized. In some embodiments, the insulator may be reflowed to planarize the insulator layer 800. Alternatively, chemical mechanical polishing (CMP) or another suitable method may be employed to planarize the insulator layer 800. RIE or another suitable method may be employed to form one or more vias or contact openings 802 on the substrate 100. CVD or another suitable method followed by RIE, CMP or another suitable method may be employed to fill such vias 802 with a conductor, such as tungsten or another suitable material, thereby forming studs 804. Additionally, one or more levels of wiring and/or interlevel dielectric may be formed on the substrate 100. In this manner, an improved finFET 806 may be formed. The finFET 806 has a reduced source-drain resistance compared to conventional transistors. The finFET 806 includes at least one source/drain diffusion region 110, 112 having silicide (e.g., a low-resistivity silicide) formed on a top surface of and on sidewalls of silicon (e.g., heavily-doped unsilicided silicon) in the source/drain diffusion regions 110, 112. For example, a source/drain diffusion region 110, 112 of the finFET 806 may include a silicide layer 700 having a thin silicide region (e.g., the first portion 706) located in the vicinity of a gate channel region 808 of the finFET 806, a thicker silicide region (e.g., the second portion 708) located in a distance away from the gate channel region 808, sidewall silicide regions (e.g., the third portion 710) which may be coupled to and/or included in outer edges of the source/drain diffusion region 110, 112 and an unsilicided silicon region 702 in the interior of the source/drain diffusion region 110, 112.

Figure 9:
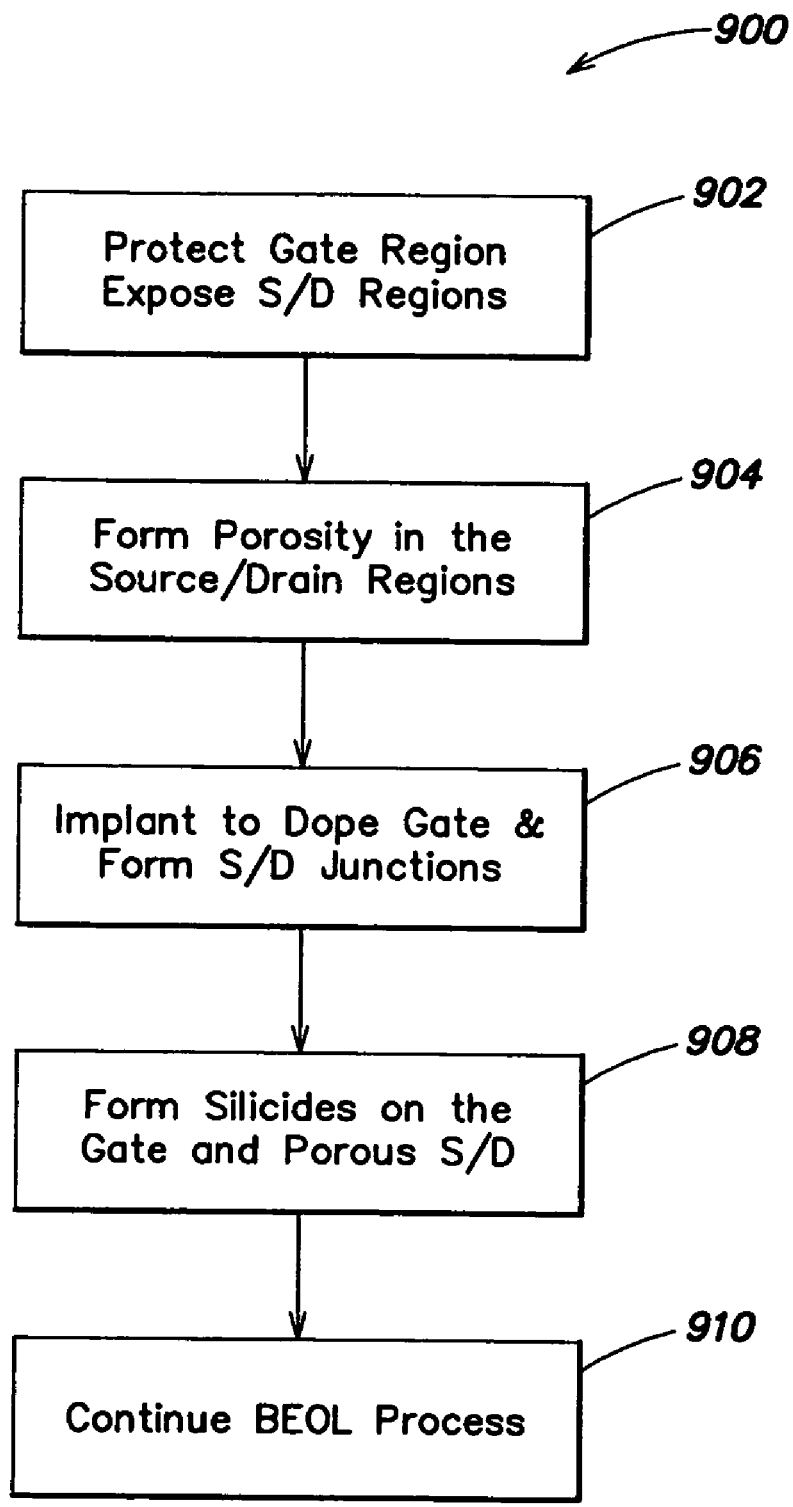
FIG. 9 illustrates a process flow of the method of manufacturing the finFET in accordance with an embodiment of the present invention.

FIG. 9 illustrates a process flow 900 of the method of manufacturing the finFET in accordance with an embodiment of the present invention. With reference to FIG. 9, during the method of manufacturing the finFET 806, in step 902, the gate region 120 may be protected (e.g., by the trim mask 300) and the source/drain diffusion regions 110, 112 may be exposed (e.g., by the trim mask 300) while the porous silicon 400 is formed in portions of the source/drain diffusion regions 110, 112. In this manner, pores may be prevented from forming in the gate conductor material layer 116, and the gate dielectric 114 is protected from damage due to the etching action of the electrolyte used to form pores in the exposed silicon. Consequently, subsequent doping and/or silicidation of the gate region 120 may be controlled. Therefore, the gate region 120 may not be doped more than desired, thereby avoiding a problem of removing a dopant, such as boron, from grain boundaries of the gate conductor material. Further, a larger portion (depth) than that desired of the gate region 120 may not be silicided, which would adversely affect a work function at an edge of the gate region 120 (e.g., for a short channel device) and threshold voltage of the finFET 806.

In step 904, porosity (e.g., porous silicon 400) may be formed in selected areas of the source/drain diffusion regions 110, 112. Details of step 904 are described below with reference to FIG. 10. After the porous silicon 400 is formed, implant and annealing process steps may be employed to form the source/drain diffusion regions 110, 112 of the finFET 806. For example, in step 906, dopant may be implanted into the substrate 100. For example, the LDD I/I and the S/D I/I may be employed to dope the gate region 120 and form junctions in the source/drain diffusion regions 110, 112. In step 908, silicidation may be employed to form the silicide layer 700 on the substrate 100 (e.g., on the gate region 120 and on the porous silicon 400 of the source/drain diffusion regions 110, 112). The silicide layer 700 may be formed inside the porous silicon 400 as well as at exposed surfaces of single-crystal silicon and polysilicon on the substrate 100. Thereafter, step 910 may be performed. In step 910, BEOL processing may continue. For example, the insulator layer 800, vias or contact openings 802, studs 804, interlevel dielectrics, wiring levels and/or the like may be formed such that contact may be made to the finFET 806. In this manner, the low source-drain resistance finFET 806 may be formed.

Figure 10:
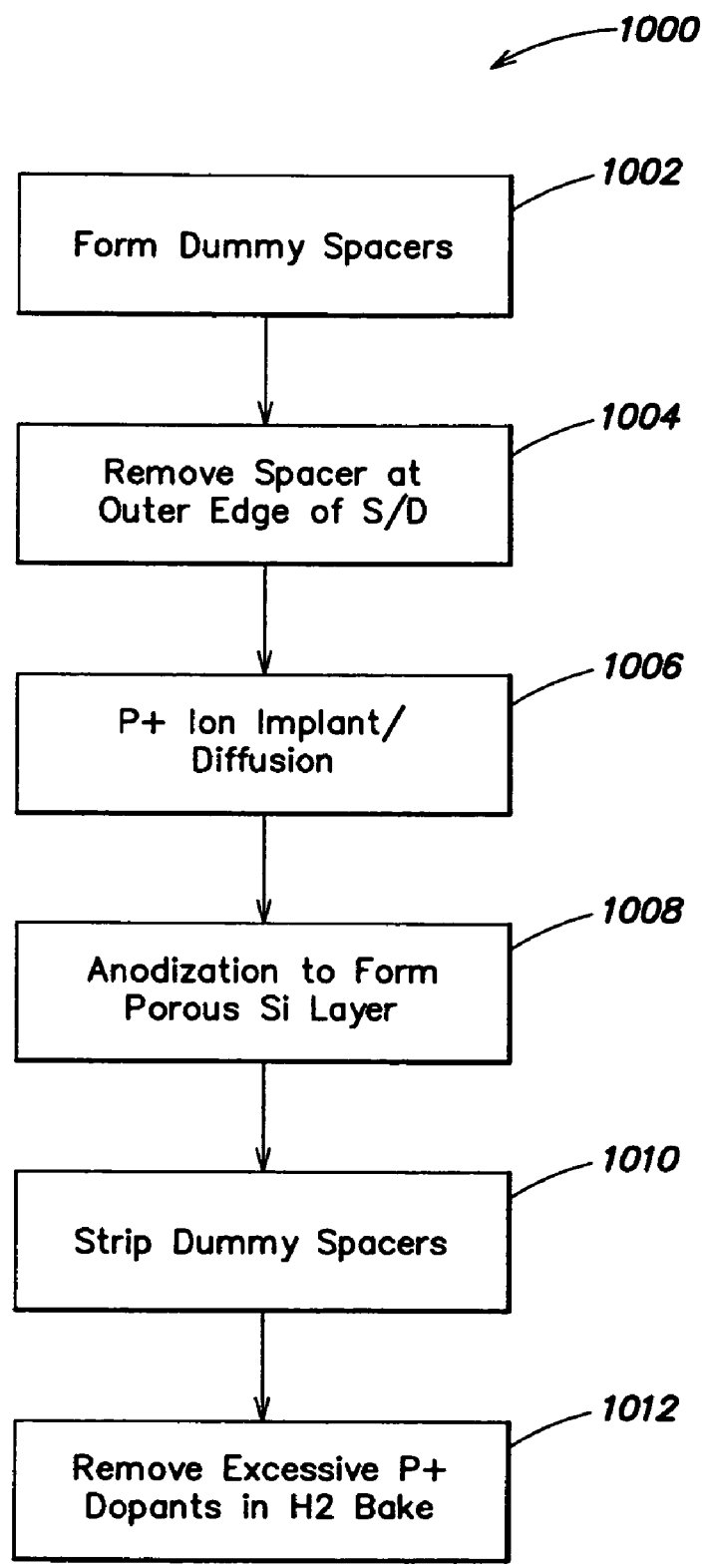
FIG. 10 illustrates sub-steps of a step in the process flow in which porous silicon is formed in source/drain diffusion regions in accordance with an embodiment of the present invention.

FIG. 10 illustrates sub-steps 1000 of a step in the process flow 900 in which porous silicon is formed in source/drain diffusion regions in accordance with an embodiment of the present invention. With reference to FIG. 10, to perform step 904, in step 1002, dummy spacers such as the sacrificial or temporary spacers 200 may be formed on the substrate 100. The temporary spacers 200 may be formed adjacent the gate region 120 and body region 106 of the substrate 100. In step 1004, portions of the temporary spacers 200 adjacent source/drain diffusion regions 110, 112 of the body region 106 may be removed using isotropic etching or the like. Such portions may be exposed during etching by the trim mask 300. Trimming away portions of the spacers 200 around the outer edges of the source/drain diffusion regions 110, 112 allows such areas to be completely converted to porous silicon 400. In step 1006, dopant (e.g., p+ dopant such as boron and/or the like) may be introduced into exposed portions of the substrate 100. Plasma immersion implantation, ion implantation (e.g., angled), gas phase doping, a solid source doping technique or conventional gaseous source diffusion process may be employed to dope the exposed portions of the substrate 100. In this manner, the source/drain diffusion regions 110, 112 may be doped after porous silicon 400 is formed.

Thereafter, in step 1008, the substrate 100 may undergo anodization such that pores form inside the p+ doped regions of the source/drain diffusion regions 110, 112. In step 1010, remaining portions of the temporary spacers 200 may be stripped from the substrate 100. RIE or another suitable method may be employed. Further, in step 1012, the substrate 100 may undergo annealing to remove excessive dopant therefrom. For example, the substrate 100 maybe subjected to a hydrogen bake (e.g., a low temperature bake in a hydrogen ambient) such that excess p+ dopant inserted in the substrate 100 during step 1006 may be removed (e.g., depleted by the bake). Through use of the present method, a finFET 806 with a unique and robust source-drain contacting scheme may be formed.

Conventional methods and apparatus for semiconductor device manufacturing pose problems. For example, when scaling CMOS technology below the 45 nm node, processes associated with the formation of a gate electrode, including the gate stack and dielectric, the channel and the source/drain regions all have to be significantly modified from earlier technology generations. Effective mitigation of short channel effects requires ever shallower junction depths. Additionally, SOI film thickness and finFET fin width also must be reduced for short channel scalability. Unless raised source/drain structures are implemented, a thinner silicide is required to cope with the shallower junctions and thinner materials. Silicidation of source-drain diffusions is required to lower series resistance for better current drivability. However, consumption of silicon under silicide leads to increased contact resistance due to dopant depletion effects. Increased source-drain doping concentration may be employed to attempt to resolve this problem. However, high doping concentration may not easily be obtained due to limitations of solid solubility and electrical activation. Furthermore, a significant fraction of the source-drain series resistance is due to the interface between the silicide layer and the silicon. This leads to sharply increased series resistance when silicide is formed completely through the source-drain silicon because a channel current is forced to flow through a small cross-sectional area dictated by the thickness of the SOI film or by the width of the FinFET fin.

Therefore, a portion of the silicon normal to the surface of the source-drain diffusion should remain unsilicided. However, it is a great challenge to reduce contact resistance between a thin silicide layer and shallow source/drain. The problem is further complicated when contacting the source-drain diffusions of conventional finFETs because sidewalls of the source-drain regions of such finFETs are covered by the spacers as a consequence of the gate processing. Therefore, silicidation of such finFET source-drain diffusions is limited to the horizontally oriented surfaces, and not the sidewalls. This results in greatly compromised source-drain resistance and degraded performance of the conventional device.

The present methods and apparatus may provide advantages over conventional finFETs and avoid the disadvantages of conventional finFETs described above. For example, by forming the sacrificial spacer 200 before forming the porous silicon 400, the subsequently-formed silicide layer 700 may be prevented from encroaching on metallurgical junctions. In this manner, the finFET 806 may avoid the high leakage currents of conventional finFETs by maintaining a low-junction leakage current. Further, a gate electrode of the finFET 806 may be protected while forming porous silicon 400 in the source/drain diffusion region 110, 112 so the finFET gate 120 has a preferred work-function.

In a conventional finFET, a source and drain region may contribute a high series resistance to the finFET. As the aspect ratio (fin height/width) of the body of such conventional finFET increases, a contact resistance problem increases. More specifically, because the sidewalls of the source/drain diffusion regions of such finFETs are often blocked by spacer material associated with gate formation, doping and silicidation occurs only on portions of a top surface of the source/drain diffusion regions. Further, a contact region on a top surface of the source/drain diffusion area is narrow, resulting in high contact resistance.

In contrast, by converting at least a portion of silicon in the source/drain diffusion regions 110, 112 into porous silicon 400, subsequently-formed silicide of the present invention may have a larger contact surface area than the planar surface area of the source/drain diffusion region 110, 112. Further, an interior of the source/drain diffusion region may remain unsilicided to increase an area of a silicide/non-silicide interface. More specifically, the silicide layer 700 may form on four sides (e.g., on three sidewalls and a top surface) of the source/drain diffusion region 110, 112 thereby reducing a contact resistance to the finFET 806. For the above reasons, compared to conventional transistors, the finFET 806 has a reduced source-drain series resistance.

Further, a source/drain ion implant is performed on the substrate 100 after forming the porous silicon 400 so that after drive-in of dopant a junction is always formed beneath the layer of porous silicon 400. Thereafter, the entire region of porous silicon 400 may be converted to silicide. Because the silicide forms mainly inside the region of porous silicon 400, dopant depletion problems are reduced and/or eliminated.

The foregoing description discloses only exemplary embodiments of the invention. Modifications of the above disclosed apparatus and methods which fall within the scope of the invention will be readily apparent to those of ordinary skill in the art. For instance, although the second implant described above is an LDD I/I, alternatively or additionally, the substrate 100 may be subjected to a halo implants or the like. For example, a concentration of about $5 \times 10^{17}$ cm$^{-3}$ to about $5 \times 10^{18}$ cm$^{-3}$ may be employed of dopant polarity opposite of the source-drain doping polarity may be implanted into the substrate 100 (although a larger or smaller and/or different concentration range and/or dopant type may be employed). The halo implant may be employed to adjust a threshold voltage of the finFET 806 being manufactured.

Accordingly, while the present invention has been disclosed in connection with exemplary embodiments thereof, it should be understood that other embodiments may fall within the spirit and scope of the invention, as defined by the following claims.

The invention claimed is:

1. A method of manufacturing a finFET, comprising:
   providing a substrate; and
   forming at least one source/drain diffusion region of the finFET on the substrate wherein forming at least one source/drain diffusion region on substrate includes forming a region of silicon on the substrate, and converting one or more portions of the silicon in the region to porous silicon;
   wherein each source/drain diffusion region includes a silicided portion of a top surface of the source/drain diffusion region, unsilicided interior portion and sidewalls of the source/drain diffusion region; and
   wherein converting one or more portions of the silicon in the region to porous silicon includes employing a contactless anodization process to convert one or more portions of the silicon in the region to porous silicon.

2. The method of claim 1 wherein converting one or more portions of the silicon in the region to porous silicon further includes removing portions of a previously-implanted dopant from the substrate using annealing.

3. The method of claim 1 further comprising employing a spacer to separate the porous silicon from a gate region of the finFET by a predetermined distance.

* * * * *